United States Patent
Chou et al.

(10) Patent No.: US 10,797,096 B2
(45) Date of Patent: Oct. 6, 2020

(54) SEMICONDUCTOR IMAGE SENSOR

(71) Applicant: TAIWAN SEMICONDUCTOR MANUFACTURING COMPANY LTD., Hsinchu (TW)

(72) Inventors: Keng-Yu Chou, Kaohsiung (TW); Wei-Chieh Chiang, Changhua County (TW); Chen-Jong Wang, Hsinchu County (TW); Chien-Hsien Tseng, Hsinchu (TW); Kazuaki Hashimoto, Hsinchu County (TW)

(73) Assignee: TAIWAN SEMICONDUCTOR MANUFACTURING COMPANY LTD., Hinschu (TW)

( * ) Notice: Subject to any disclaimer, the term of this patent is extended or adjusted under 35 U.S.C. 154(b) by 0 days.

(21) Appl. No.: 16/706,189

(22) Filed: Dec. 6, 2019

(65) Prior Publication Data
US 2020/0111822 A1    Apr. 9, 2020

Related U.S. Application Data

(63) Continuation of application No. 15/928,748, filed on Mar. 22, 2018, now Pat. No. 10,510,788.
(Continued)

(51) Int. Cl.
*H01L 31/0232*    (2014.01)
*H01L 27/146*    (2006.01)

(52) U.S. Cl.
CPC ...... *H01L 27/1463* (2013.01); *H01L 27/1464* (2013.01); *H01L 27/14629* (2013.01);
(Continued)

(58) Field of Classification Search
CPC ......... H01L 27/14623; H01L 27/14629; H01L 27/1463; H01L 27/1464; H01L 31/02164
See application file for complete search history.

(56) References Cited

U.S. PATENT DOCUMENTS 7,470,965 B2    12/2008  Kuriyama
9,130,072 B1 *   9/2015  Chen .................... H01L 27/1464
(Continued)

FOREIGN PATENT DOCUMENTS

CN    1595657 A    3/2005
CN    105826301 A    8/2016
(Continued)

OTHER PUBLICATIONS

Office Action and Search Report dated Apr. 29, 2020 issued by China National Intellectual Property Administration for counterpart application 201811139872.0.
(Continued)

*Primary Examiner* — George R Fourson, III
(74) *Attorney, Agent, or Firm* — WPAT, P.C., Intellectual Property Attorneys; Anthony King

(57) ABSTRACT

A BSI image sensor includes a substrate including a front side and a back side opposite to the front side, a plurality of pixel sensors arranged in an array, an isolation grid disposed in the substrate and separating the plurality of pixel sensors from each other, a reflective grid disposed over the isolation grid on the back side of the substrate, an a low-n grid disposed over the back side of the substrate and overlapping the reflective grid from a top view. A depth of the reflective grid is less than a depth of the isolation grid. A width of the low-n grid is greater than a width of the reflective grid.

20 Claims, 12 Drawing Sheets

Related U.S. Application Data

(60) Provisional application No. 62/579,474, filed on Oct. 31, 2017.

(52) U.S. Cl.
CPC .. *H01L 27/14612* (2013.01); *H01L 27/14621* (2013.01); *H01L 27/14627* (2013.01)

(56) References Cited

U.S. PATENT DOCUMENTS

| | | | |
|---|---|---|---|
| 9,564,468 B2 | 2/2017 | Chou et al. | |
| 9,786,704 B2 | 10/2017 | Cheng et al. | |
| 2012/0273906 A1* | 11/2012 | Mackey | H01L 31/02327 257/432 |
| 2013/0285181 A1* | 10/2013 | Lin | H01L 27/1463 257/432 |
| 2015/0155320 A1* | 6/2015 | Chien | H01L 31/02164 257/432 |
| 2016/0225813 A1* | 8/2016 | Liao | H01L 27/14623 |
| 2017/0077163 A1* | 3/2017 | Chou | H04N 5/3696 |
| 2017/0154917 A1* | 6/2017 | Lu | H01L 27/1463 |
| 2017/0339353 A1* | 11/2017 | Banachowicz | H04N 5/3696 |
| 2018/0166475 A1* | 6/2018 | Chen | H01L 27/1463 |
| 2018/0254294 A1* | 9/2018 | Cheng | H01L 27/1464 |
| 2018/0358392 A1* | 12/2018 | Hsieh | H01L 27/14685 |
| 2019/0198536 A1* | 6/2019 | Wang | H01L 27/1464 |

FOREIGN PATENT DOCUMENTS

| | | |
|---|---|---|
| CN | 1595657 A | 10/2016 |
| CN | 105990384 A | 3/2017 |

OTHER PUBLICATIONS

English Abstract Translation of Foreign Reference CN 105826301.
U.S. Pat. No. 7,470,965 is the English counterpart application to Foreign Reference CN 1595657 A.
U.S. Pat. No. 9,564,468 is the English counterpart application to Foreign Reference CN 105990384 A.
U.S. Pat. No. 9,786,704 is the English counterpart application to Foreign Reference CN 106531750 A.

* cited by examiner

SEMICONDUCTOR IMAGE SENSOR

PRIORITY DATA

This application is a continuation of U.S. patent application Ser. No. 15/928,748, filed on Mar. 22, 2018, entitled of "SEMICONDUCTOR IMAGE SENSOR", which claims priority of U.S. Provisional Patent Application Ser. No. 62/579,474 filed Oct. 31, 2017, the entire disclosure of which is hereby incorporated by reference.

BACKGROUND

Digital cameras and other imaging devices employ images sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
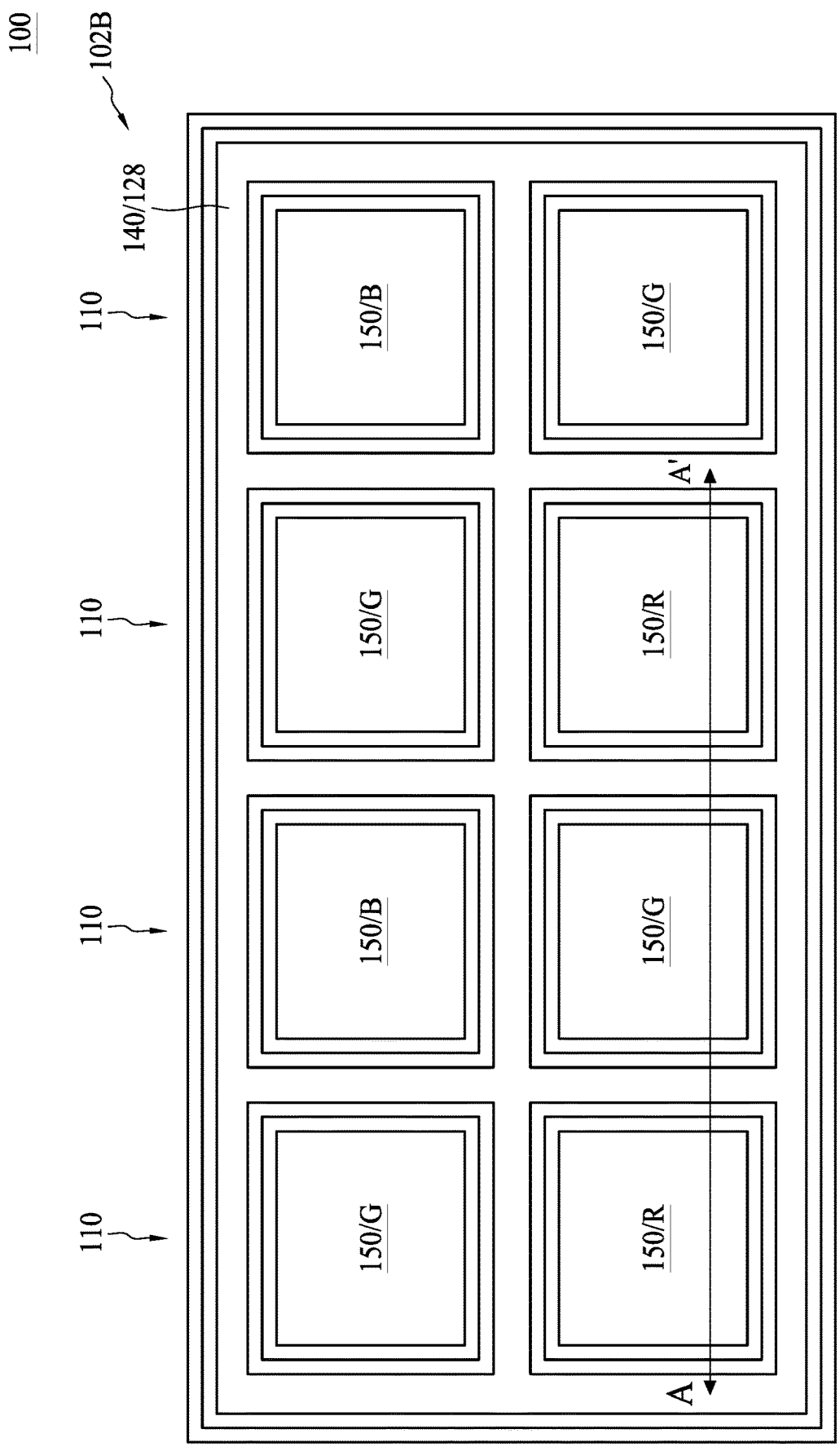
FIG. 1 is a top view of a portion of a semiconductor image sensor according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

BSI image sensor includes an array of pixel sensors. Typically, BSI image sensors include an integrated circuit having a semiconductor substrate and light-sensing devices such as photodiodes corresponding to the pixel sensors arranged within the substrate, a back-end-of-line (BEOL) metallization of the integrated circuits disposed over a front side of the substrate, and an optical stack including color filters and micro-lens corresponding to the pixel sensors disposed over a back side of the substrate. As the size of BSI image sensors decrease, BSI image sensors face a number of challenges. One challenge with BSI image sensors is cross talk between neighboring pixel sensors. As BSI image sensors become smaller and smaller, distance between neighboring pixel sensors becomes smaller and smaller, thereby increasing the likelihood of cross talk. Another challenge with BSI image sensors is light collection. Also as image sensors become smaller and smaller, the surface area for light collection becomes smaller and smaller, thereby reducing the sensitivity of pixel sensors. This is problematic for low light environments. Therefore, it is in need to reduce cross talk and to increase absorption efficiency of the pixel sensors such that performance and sensitivity of BSI image sensors is improved.

The present disclosure therefore provides a pixel sensor of a BSI image sensor including a reflective grid buried in the isolation structure used to provide isolation between neighboring light-sensing devices. In some embodiments, the present disclosure provides a hybrid isolation disposed in the substrate, and the hybrid isolation includes the reflective grid. The reflective structure serves as a light guide or a mirror that light are reflected back to the light-sensing device. In other words, light is directed and reflected to the pixel sensor instead of entering to the neighboring pixel sensors. Accordingly, cross talk is reduced, and thus performance and sensitivity of the pixel sensors are both improved.

Figure 2:
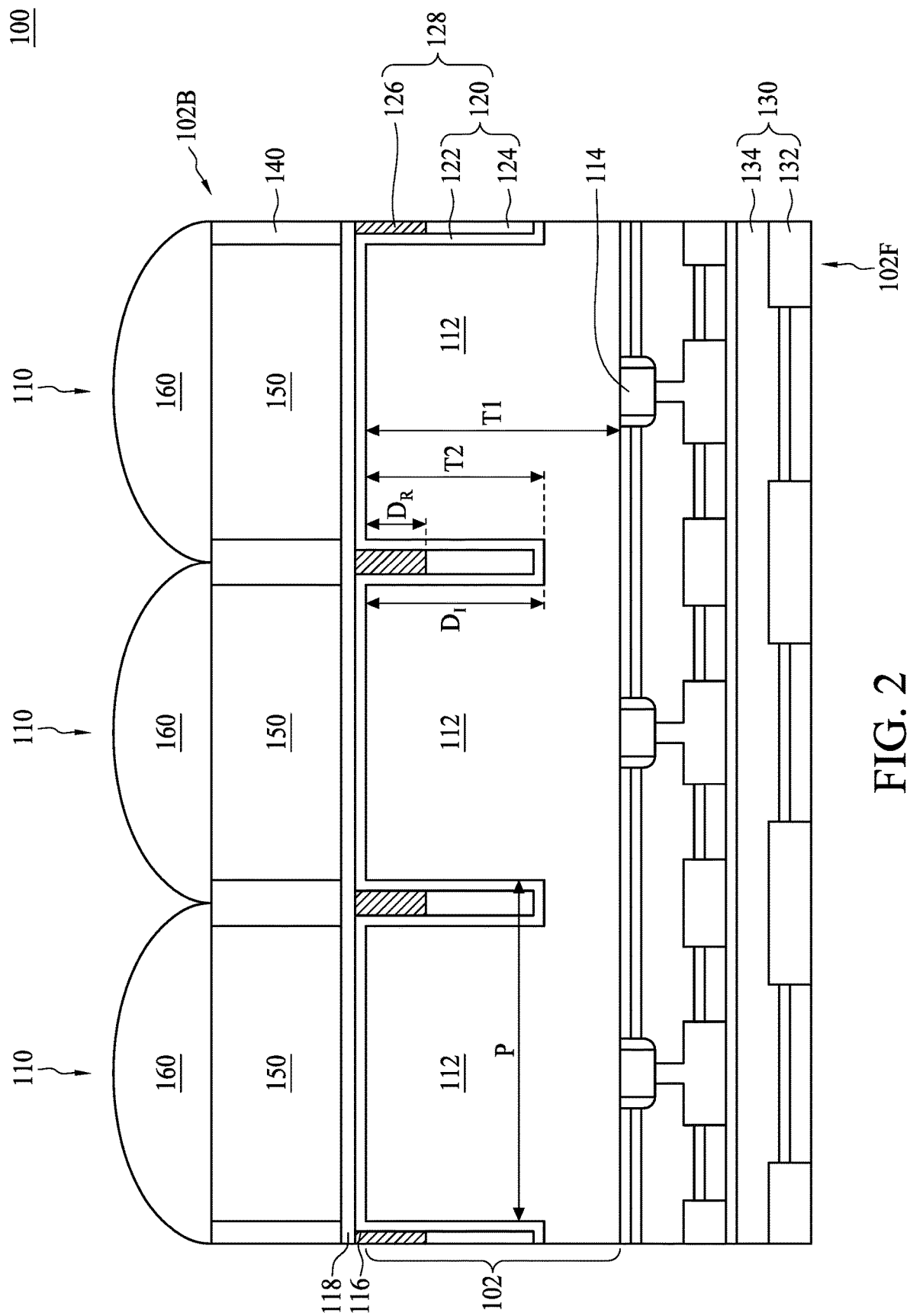
FIG. 2 is a cross-sectional view of a portion of a semiconductor image sensor taken along a line A-A' of FIG. 1 according to aspects of the present disclosure in one or more embodiments.

FIG. 1 is a top view of a portion of a semiconductor image sensor 100 according to aspects of the present disclosure in one or more embodiments, and FIG. 2 is a cross-sectional view of a portion of the semiconductor image sensor 100 taken along a line A-A' of FIG. 1 according to aspects of the present disclosure in some embodiments. In some embodiments, the semiconductor image sensor 100 is a BSI image sensor 100. As shown in FIGS. 1 and 2, the BSI image sensor 100 includes a substrate 102, and the substrate 102 includes, for example but not limited to, a bulk semiconductor substrate such as a bulk silicon (Si) substrate, or a silicon-on-insulator (SOI) substrate. The substrate 102 has a front side 102F and a back side 102B opposite to the front side 102F. The BSI image sensor 100 includes a plurality of pixel sensors 110 typically arranged within an array, and each of the pixel sensors 110 includes a light-sensing device such as a photodiode 112 disposed in the substrate 102. In other words, the BSI image sensor 100 includes a plurality of photodiodes 112 corresponding to the pixel sensors 110. The photodiodes 112 are arranged in rows and columns in the substrate 102, and configured to accumulate charge (e.g. electrons) from photons incident thereon. Further, logic devices, such as transistors 114, can be disposed over the substrate 102 on the front side 102F and configured to enable readout of the photodiodes 112. The pixel sensors 110 are disposed to receive light with a predetermined wavelength. Accordingly, the photodiodes 112 can be operated to sense visible light of incident light in some embodiments.

In some embodiments, a plurality of isolation structures 120 is disposed in the substrate 102 as shown in FIG. 2. In some embodiments, the isolation structure 120 includes a deep trench isolation (DTI) and the DTI structure can be formed by the following operations. For example, a first etch is performed from the back side 102B of the substrate 102. The first etch results in a plurality of deep trenches (not show) surrounding and between the photodiodes 112 of the pixel sensors 110. An insulating material such as silicon oxide (SiO) is then formed to fill the deep trenches using any suitable deposition technique, such as chemical vapor deposition (CVD). In some embodiments, sidewalls and bottoms of the deep trenches are lined by a dielectric layer 122, such as a coating 122 and the deep trenches are then filled up by an insulating structure 124. The coating 122 may include a low-n material, which has a refractive index (n) less than color filter formed hereafter. The low-n material can include SiO or hafnium oxide (HfO), but the disclosure is not limited to this. In some embodiments, the insulating structure 124 filling the deep trenches can include the low-n insulating material. In some embodiments, a planarization is then performed to remove superfluous insulating material, thus the surface of the substrate 102 on the back side 102B is exposed, and the DTI structures 120 surrounding and between the photodiodes 112 of the pixel sensors 110 are obtained as shown in FIG. 2.

More importantly, a portion of the insulating structure 124 is then removed and thus a plurality of recesses (not shown) may be formed in each DTI structure 120. Next, a conductive material such as tungsten (W), copper (Cu), or aluminum-copper (AlCu), or other suitable material is formed to fill the recess. Accordingly, a conductive structure 126 is formed over the insulating structure 124 as shown in FIG. 2. The conductive structure 126, the insulating structure 124 and the dielectric layer 122 construct a hybrid isolation 128 surrounding each photodiode 112 of the pixel sensor 110. In other words, a hybrid isolation 128 including the dielectric layer 122, the insulating structure 124 and the conductive structure 126 is provided and disposed in the substrate 102 according to some embodiments. In some embodiments, a thickness T2 of the hybrid isolation 128 is less than a thickness T1 of the substrate 102. In some embodiments, the dielectric layer 122 covers at least sidewalls of the conductive structure 126. Further, the dielectric layer 122 covers sidewalls and a bottom surface of the insulating structure 124.

In some embodiments, an anti-reflective coating (ARC) 116 is disposed over the substrate 102 on the back side 102B, and a passivation layer 118 is disposed over the ARC 116. In some embodiments, the ARC 116 and the dielectric layer 122 include the same material and can be formed at the same time. Thus a substantially flat and even surface is obtained on the back side 102B of the substrate 102 as shown in FIG. 2.

A back-end-of-line (BEOL) metallization stack 130 is disposed over the front side 102F of the substrate 102. The BEOL metallization stack 130 includes a plurality of metallization layers 132 stacked in an interlayer dielectric (ILD) layer 134. One or more contacts of the BEOL metallization stack 130 is electrically connected to the logic device 114. In some embodiments, the ILD layer 134 can include a low-k dielectric material (i.e., a dielectric material with a dielectric constant less than 3.9) or an oxide, but the disclosure is not limited to this. The plurality of metallization layers 132 may include a metal such as copper (Cu), tungsten (W), or aluminum (Al), but the disclosure is not limited to this. In some embodiments, another substrate (not shown) can be disposed between the metallization structure 130 and external connectors such as a ball grid array (BGA) (not shown). And the BSI image sensor 100 is electrically connected to other devices or circuits through the external connectors, but the disclosure is not limited to this.

Referring to FIGS. 1 and 2, in some embodiments, a plurality of color filters 150 corresponding to the pixel sensors 110 is disposed over the substrate 102 on the back side 102B. Further, another insulating structure 140 is disposed between the color filters 150. In some embodiments, the insulating structure 140 includes a grid structure and the color filters 150 are located within the grid. Thus the insulating structure 140 surrounds each color filter 150, and separates the color filters 150 from each other as shown in FIGS. 1 and 2. The insulating structure 140 can include materials with a refractive index less than the refractive index of the color filters 150 or less than a refractive index of Si, but the disclosure is not limited to this. Further, the conductive structure 126 is disposed between the insulating structure 124 and the insulating structure 140, as shown in FIGS. 1 and 2.

Each of the color filters 150 is disposed over each of the corresponding photodiodes 112. The color filters 150 are assigned to corresponding colors or wavelengths of lights, and configured to filter out all but the assigned colors or wavelengths of lights. Typically, the color filters 150 assignments alternate between red, green, and blue lights, such that the color filters 150 include red color filters 150/R, green color filters 150/G and blue color filters 150/B, as shown in FIG. 1. In some embodiments, the red color filters 150/R, the green color filters 150/G and the blue color filters 150/B are arranged in a Bayer or other mosaic pattern, but the disclosure is not limited to this.

In some embodiments, a micro-lens 160 corresponding to each pixel sensor 110 is disposed over the color filter 150. It should be easily understood that locations and areas of each micro-lens 160 correspond to those of the color filter 150 or those of the pixel sensor 110 as shown in FIG. 2.

In some embodiments, the insulating structures 124 and the dielectric layers 122 of the hybrid isolations 128 form an isolation grid 120 in the substrate 102, and the isolation grid 120 provides electrical isolation between neighboring pixel sensors 110. In other words, the isolation grid 120 separates the plurality of pixel sensors 110 including the photodiodes 112 from each other. In some embodiments, a depth $D_I$ of the isolation grid 120 is less than the thickness T1 of the substrate 102, as shown in FIG. 2. In some embodiments, the conductive structures 126 of the hybrid isolations 128 form a reflective grid 126 disposed over the isolation grid 120 on the back side 102B of the substrate 102. In some embodiments, the depth $D_I$ of the isolation grid 120 is less than the thickness T1 of the substrate 102, and a depth $D_R$ of the reflective grid 126 is less than the depth $D_I$ of the isolation grid 120. It should be noted that depth $D_R$ of the reflective grid 126 is related to a pitch P of the pixel sensor 110. For example but not limited to, the depth $D_R$ of the reflective grid 126 can be greater than 0.1 micrometer (μm) and less than the depth $D_I$ of the isolation grid 120 when the pitch P of the pixel sensor 110 is about 0.9 μm. In some embodiments, the depth $D_R$ of the reflective grid 126 can be greater than 0.2 μm and less than the depth $D_I$ of the isolation grid 120 when the pitch P of the pixel sensor 110 is about 0.7 μm. In some embodiments, the insulating structures 140 between the color filters 150 form a low-n grid 140 over the substrate 102 on the back side 102B. Thus, the low-n grid 140 separates the color filters 150 from each other. As shown in FIG. 2, the reflective grid 126 is disposed between the low-n grid 140 and the isolation grid 120. Further, the low-n grid 140 overlaps the reflective grid 126 and the isolation grid 120 from a plan view, in some embodiments.

Due to the low refractive index, the low-n grid 140 serves as a light guide to direct or reflect light to the color filters 150. Consequently, the low-n structure 140 effectively increases the amount of the light incident into the color filters 150. Further, due to the low refractive index, the low-n grid 140 provides optical isolation between neighboring color filters 150. The reflective grid 126 serves as a light guide or a mirror, and reflects light to the photodiode 112. Consequently, the reflective grid 126 effectively increases the amount of light to be absorbed by photodiode 112 and thus provides optical isolation between neighboring pixel sensors 110. On the other hands, the isolation grid 120 including the dielectric layer 122 and the insulating structure 124 provides electrical isolation between the neighboring pixel sensors 110. In other words, the isolation grid 120 separates the plurality of pixel sensors 110 including the photodiodes 112 from each other thereby serving as a substrate isolation grid and reducing cross-talk.

Figure 3:
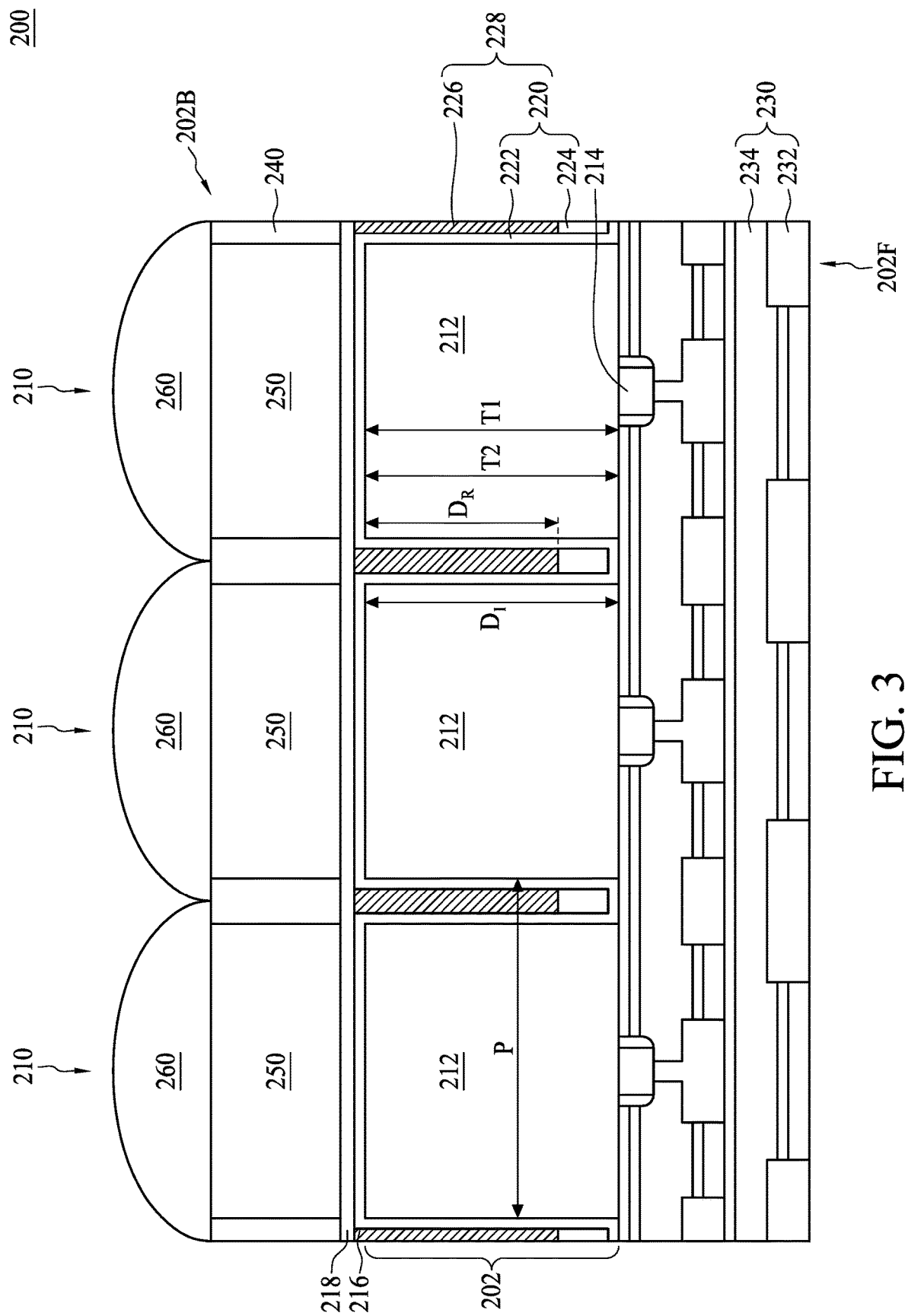
FIG. 3 is a cross-sectional view of a portion of a semiconductor image sensor according to aspects of the present disclosure in one or more embodiments.

FIG. 3 is a cross-sectional view of a portion of a semiconductor image sensor 200 according to aspects of the present disclosure in one or more embodiments. It should be easily understood elements the same in the BSI image sensor 100 and the BSI image sensor 200 can include the same material and/or formed by the same operations, and thus those details are omitted in the interest of brevity. In some embodiments, the semiconductor image sensor 200 is a BSI image sensor 200. In some embodiments, a top view of the BSI images sensor 200 can be similar as shown FIG. 1, but the disclosure is not limited to this. As shown in FIG. 3, the BSI image sensor 200 includes a substrate 202, and the substrate 202 has a front side 202F and a back side 202B opposite to the front side 202F. The BSI image sensor 200 includes a plurality of pixel sensors 210 typically arranged within an array. A plurality of photo-sensing devices such as photodiodes 212 corresponding to the pixel sensors 210 is disposed in the substrate 202. The photodiodes 212 are arranged in rows and columns in the substrate 202. In other words, each of the pixel sensors 210 includes a photo-sensing device such as the photodiode 212. Further, logic devices, such as transistors 214, are disposed over the front side 202F of the substrate 202 and configured to enable readout of the photodiodes 212.

A plurality of isolation structures 220 is disposed in the substrate 202 as shown in FIG. 3. In some embodiments, the isolation structure 220 includes a DTI structure and the DTI structure can be formed by operations as mentioned above. Therefore, those details are omitted in the interest of brevity. In some embodiments, sidewalls and bottoms of the deep trenches are lined by a dielectric layer 222, such as a coating 222 and the deep trenches are then filled up by an insulating structure 224. As mentioned above, the coating 222 may include a low-n material, which has a refractive index (n) less than color filter formed hereafter. The low-n material can include SiO or hafnium oxide (HfO), but the disclosure is not limited to this. In some embodiments, the insulating structure 224 filling the deep trenches can include the low-n insulating material. A planarization is then performed to remove superfluous insulating material, thus the surface of the substrate 202 on the back side 202B is exposed, and the DTI structures 220 surrounding and between the photodiodes 212 of the pixel sensors 210 are obtained as shown in FIG. 3.

More importantly, a portion of the insulating structure 224 is then removed and thus a recess (not shown) may be formed in each DTI structure 220. Next, a conductive material such as W, Cu, or AlCu, or other suitable material is formed to fill the recess. Accordingly, a conductive structure 226 is formed over the insulating structure 224. The conductive structure 226, the insulating structure 224 and the dielectric layer 222 construct a hybrid isolation 228 surrounding each photodiode 212 of the pixel sensor 210. In other words, a hybrid isolation 228 including the dielectric layer 222, the insulating structure 224 and the conductive structure 226 is provided and disposed in the substrate 202 according to some embodiments. In some embodiments, a thickness T2 of the hybrid isolation 228 is substantially equal to a thickness T1 of the substrate 202. In some embodiments, the dielectric layer 222 covers at least sidewalls of the conductive structure 226. Further, the dielectric layer 222 covers sidewalls and a bottom surface of the insulating structure 224.

In some embodiments, an ARC 216 is disposed over the substrate 202 on the back side 202B, and a passivation layer 218 is disposed over the ARC 216. In some embodiments, the ARC 216 and the dielectric layer 222 include the same material and can be formed at the same time. Thus a substantially flat and even surface is obtained on the back side 202B of the substrate 202 as shown in FIG. 3.

A BEOL metallization stack 230 is disposed over the front side 202F of the substrate 202. As mentioned above the BEOL metallization stack 230 includes a plurality of metallization layers 232 stacked in an ILD layer 234. One or more contacts of the BEOL metallization stack 230 are electrically connected to the logic device 214. In some embodiments, another substrate (not shown) can be disposed between the metallization structure 230 and external connectors such as a ball grid array (BGA) (not shown). And the BSI image sensor 200 is electrically connected to other devices or circuits through the external connectors, but the disclosure is not limited to this.

Referring to FIG. 3, in some embodiments, a plurality of color filters 250 corresponding to the pixel sensors 210 is disposed over the pixel sensors 210 on the back side 202B of the substrate 202. Further, another insulating structure 240 is disposed between the color filters 250. In some embodiments, the insulating structure 240 includes a grid structure and the color filters 250 are located within the grid. Thus the insulating structure 240 surrounds each color filter 250, and separates the color filters 250 from each other as shown in FIG. 3. The insulating structure 240 can include materials with a refractive index less than the refractive index of the color filters 250 or a material with a refractive index less than a refractive index of Si, but the disclosure is not limited to this. Further, the conductive structure 226 is disposed between the insulating structure 224 and the insulating structure 240, as shown in FIG. 3.

As mentioned above, each of the color filters 250 is disposed over each of the corresponding photodiodes 212. The color filters 250 are assigned to corresponding colors or wavelengths of lights, and configured to filter out all but the assigned colors or wavelengths of lights. Typically, the color filters 250 assignments alternate between red, green, and blue lights, such that the color filters 250 include red color filters, green color filters and blue color filters. In some embodiments, the red color filters, the green color filters and the blue color filters are arranged in a Bayer or other mosaic pattern, but the disclosure is not limited to this. In some embodiments, a micro-lens 260 corresponding to each pixel sensor 210 is disposed over the color filter 250. It should be easily understood that locations and areas of each micro-lens 260 correspond to those of the color filter 250 or those of the pixel sensor 210 as shown in FIG. 3.

In some embodiments, the insulating structures 224 and the dielectric layers 222 of the hybrid isolations 228 form an isolation grid 220 in the substrate 202, and the isolation grid 220 provides electrical isolation between neighboring pixel sensors 210. In other words, the isolation grid 220 separates the plurality of pixel sensors 210 including the photodiodes 212 from each other. In some embodiments, a depth $D_I$ of the isolation grid 220 is less than the thickness T1 of the substrate 202, as shown in FIG. 3. In some embodiments, the conductive structures 226 of the hybrid isolations 228 form a reflective grid 226 disposed over the isolation grid 220 on the back side 202B of the substrate 202. In some embodiments, a depth $D_I$ of the isolation grid 220 is substantially equal to the thickness T1 of the substrate 202, and a depth $D_R$ of the reflective grid 226 is less than the depth $D_I$ of the isolation grid 220. As mentioned above, the depth $D_R$ of the reflective grid 226 is related to a pitch P of the pixel sensor 210. In some embodiments, the insulating structures 240 between the color filters 250 form a low-n grid 240 over the substrate 202 on the back side 202B. Thus, the low-n grid 240 separates the color filters 250 from each other. As shown in FIG. 3, the reflective grid 226 is disposed between the low-n grid 240 and the isolation grid 220. Further, the low-n grid 240 overlaps the reflective grid 226 and the isolation grid 220 from a plan view, in some embodiments.

Due to the low refractive index, the low-n grid 240 serves as a light guide to direct or reflect light to the color filters 250. Consequently, the low-n structure 240 effectively increases the amount of the light incident into the color filters 250. Further, due to the low refractive index, the low-n grid 240 provides optical isolation between neighboring color filters 250. The reflective grid 226 serves as a light guide or a mirror, and reflects light to the photodiode 212. Consequently, the reflective grid 226 effectively increases the amount of light to be absorbed by photodiode 212 and thus provides optical isolation between neighboring pixel sensors 210. On the other hands, the isolation grid 220 including the dielectric layer 222 and the insulating structure 224 provides electrical isolation between the neighboring pixel sensors 210. In other words, the isolation grid 220 separates the plurality of pixel sensors 210 including the photodiodes 212 from each other thereby serving as a substrate isolation grid and reducing cross-talk.

Figure 4:
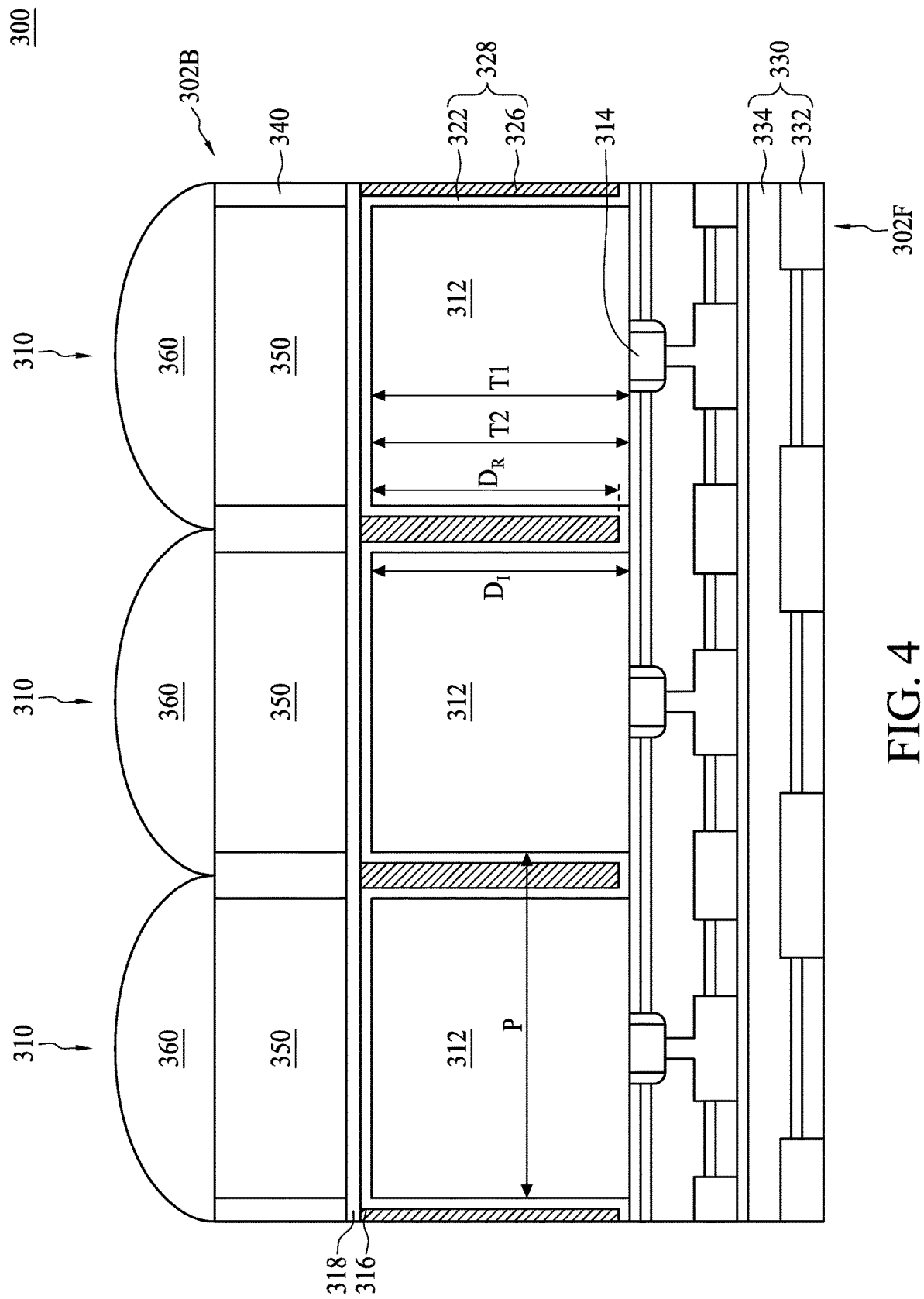
FIG. 4 is a cross-sectional view of a portion of a semiconductor image sensor according to aspects of the present disclosure in one or more embodiments.

FIG. 4 is a cross-sectional view of a portion of a BSI image sensor 300 according to aspects of the present disclosure in one or more embodiments. It should be easily understood elements the same in the BSI image sensors 100/200 and the BSI image sensor 300 can include the same material and/or formed by the same operations, and thus those details are omitted in the interest of brevity. In some embodiments, the semiconductor image sensor 300 is a BSI image sensor 300. In some embodiments, a top view of the BSI images sensor 300 can be similar as shown FIG. 1, but the disclosure is not limited to this. As shown in FIG. 4, the BSI image sensor 300 includes a substrate 302, and the substrate 302 has a front side 302F and a back side 302B opposite to the front side 302F. The BSI image sensor 300 includes a plurality of pixel sensors 310 typically arranged within an array. A plurality of photo-sensing devices such as photodiodes 312 corresponding to the pixel sensors 310 is disposed in the substrate 302. The photodiodes 312 are arranged in rows and columns in the substrate 302. In other words, each of the pixel sensors 310 includes a photo-sensing device such as the photodiode 312. Further, logic devices, such as transistors 314, are disposed over the front side 302F of the substrate 302 and configured to enable readout of the photodiodes 312.

A hybrid isolation 328 is disposed in the substrate 302 as shown in FIG. 4. In some embodiments, the hybrid isolation 328 can be formed by operations for forming DTI structure, but the disclosure is not limited to this. For example, a first etch is performed from the back side 302B of the substrate 302. The first etch results in a plurality of deep trenches (not show) surrounding and between the photodiodes 312. In some embodiments, sidewalls and bottoms of the deep trenches are lined by a dielectric layer 322, such as a coating 322. The coating 322 may include a low-n material, which has a refractive index less than color filter formed hereafter. Next, a conductive material such as W, Cu, AlCu, or other suitable material is formed to fill the trenches. Accordingly, a conductive structure 326 is disposed in each deep trench. The conductive structure 326 and the dielectric layer 322 construct the hybrid isolation 328. In other words, a hybrid isolation 328 including the dielectric layer 322 and the conductive structure 326 is provided and disposed in the substrate 302 according to some embodiments. In some embodiments, a thickness T2 of the hybrid isolation 328 is substantially equal to a thickness T1 of the substrate 302. Further, the dielectric layer 322 covers sidewalls and a bottom surface of the conductive structure 326, as shown in FIG. 4.

In some embodiments, an ARC 316 is disposed over the substrate 302 on the back side 302B, and a passivation layer 318 is disposed over the ARC 316. In some embodiments, the ARC 316 and the dielectric layer 322 include the same material and can be formed at the same time. Thus a substantially flat and even surface is obtained on the back side 302B of the substrate 302 as shown in FIG. 4.

A BEOL metallization stack 330 is disposed over the front side 302F of the substrate 302. As mentioned above, the BEOL metallization stack 330 includes a plurality of metallization layers 332 stacked in an ILD layer 334. One or more contacts of the BEOL metallization stack 330 are electrically connected to the logic device 314. In some embodiments, another substrate (not shown) can be disposed between the metallization structure 330 and external connectors such as a ball grid array (BGA) (not shown). And the BSI image sensor 300 is electrically connected to other devices or circuits through the external connectors, but the disclosure is not limited to this.

Referring to FIG. 4, in some embodiments, a plurality of color filters 350 corresponding to the pixel sensors 310 is disposed over the pixel sensors 310 on the back side 302B of the substrate 302. Further, an insulating structure 340 is disposed between the color filters 350. In some embodiments, the insulating structure 340 includes a grid structure and the color filters 350 are located within the grid. Thus the insulating structure 340 surrounds each color filter 350, and separates the color filters 350 from each other as shown in FIG. 4. The insulating structure 340 can include materials with a refractive index less than the refractive index of the color filters 350 or a material with a refractive index less than a refractive index of Si, but the disclosure is not limited to this.

As mentioned above, each of the color filters 350 is disposed over each of the corresponding photodiodes 312. The color filters 350 are assigned to corresponding colors or wavelengths of lights, and configured to filter out all but the assigned colors or wavelengths of lights. Typically, the color filters 350 assignments alternate between red, green, and blue lights, such that the color filters 350 include red color filters, green color filters and blue color filters. In some embodiments, the red color filters, the green color filters and the blue color filters are arranged in a Bayer or other mosaic pattern, but the disclosure is not limited to this. In some embodiments, a micro-lens 360 corresponding to each pixel sensor 310 is disposed over the color filter 350. It should be easily understood that locations and areas of each micro-lens 360 correspond to those of the color filter 350 or those of the pixel sensor 310 as shown in FIG. 4.

In some embodiments, the dielectric layers 322 of the hybrid isolations 328 form an isolation grid 320 in the substrate 302, and the isolation grid 320 provides electrical isolation between neighboring pixel sensors 310. In some embodiments, a depth $D_I$ of the isolation grid 320 is substantially equal to the thickness T1 of the substrate 302, as shown in FIG. 4. In some embodiments, the conductive structures 326 of the hybrid isolations 328 form a reflective grid 326 disposed in the substrate 302. In some embodiments, a depth $D_I$ of the isolation grid 320 is substantially equal to the thickness T1 of the substrate 302, and a depth $D_R$ of the reflective grid 326 is less than the depth $D_I$ of the isolation grid 320. As mentioned above, the depth $D_R$ of the reflective grid 326 is related to a pitch P of the pixel sensor 310. In some embodiments, the insulating structures 340 between the color filters 350 form a low-n grid 340 over the substrate 302 on the back side 302B. As shown in FIG. 4, the reflective grid 326 is disposed between the low-n grid 340 and the isolation grid 320. Further, the low-n grid 340 overlaps the reflective grid 326 from a plan view, in some embodiments.

Due to the low refractive index, the low-n grid 340 serves as a light guide to direct or reflect light to the color filters 350. Consequently, the low-n structure 340 effectively increases the amount of the light incident into the color filters 350. Further, due to the low refractive index, the low-n grid 340 provides optical isolation between neighboring color filters 350. The reflective grid 326 serves as a light guide or a mirror, and reflects light to the photodiode 312. Consequently, the reflective grid 326 effectively increases the amount of light to be absorbed by photodiode 312 and thus provides optical isolation between neighboring pixel sensors 310. On the other hands, the isolation grid 320 including the dielectric layer 322 provides electrical isolation between the neighboring pixel sensors 310. In other words, the isolation grid 320 separates the plurality of pixel sensors 310 including the photodiodes 312 from each other thereby serving as a substrate isolation grid and reducing cross-talk.

Figure 5:
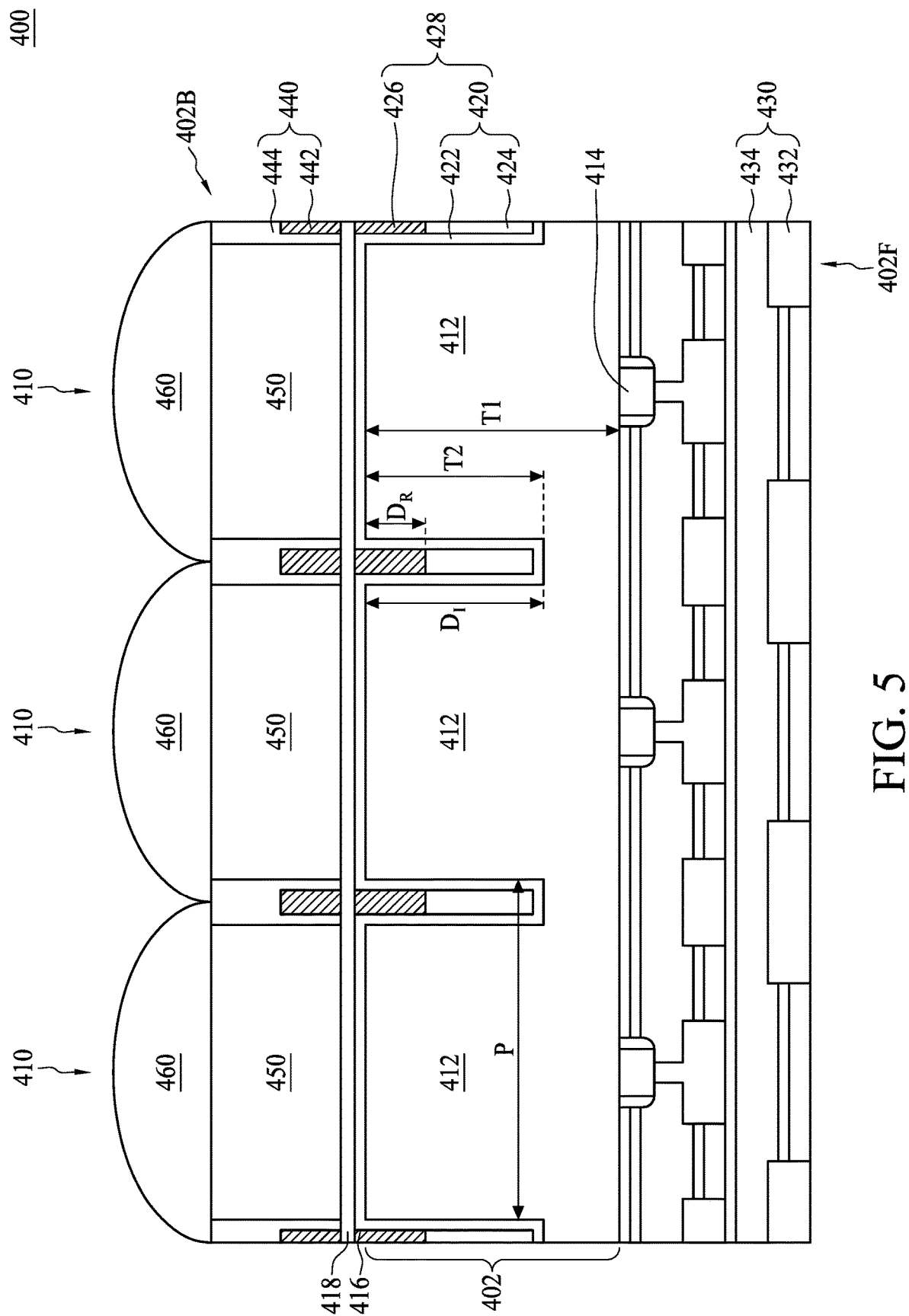
FIG. 5 is a cross-sectional view of a portion of a semiconductor image sensor according to aspects of the present disclosure in one or more embodiments.

FIG. 5 is a cross-sectional view of a portion of a BSI image sensor 400 according to aspects of the present disclosure in one or more embodiments. It should be noted that the same elements in the BSI image sensor 400 and the BSI image sensor 100/200/300 can include the same material and/or formed by the same operations, and thus those details are omitted in the interest of brevity. In some embodiments, the semiconductor image sensor 400 is a BSI image sensor 400. In some embodiments, a top view of the BSI images sensor 400 can be similar as shown FIG. 1, but the disclosure is not limited to this. As shown in FIG. 5, the BSI image sensor 400 includes a substrate 402. The substrate 402 has a front side 402F and a back side 402B opposite to the front side 402F. The BSI image sensor 400 includes a plurality of pixel sensors 410 typically arranged within an array, and each of the pixel sensors 410 includes a light-sensing device such as a photodiode 412 disposed in the substrate 402. In other words, the BSI image sensor 400 includes a plurality of photodiodes 412 corresponding to the pixel sensors 410. The photodiodes 412 are arranged in rows and columns in the substrate 402, and configured to accumulate charge (e.g. electrons) from photons incident thereon. Further, logic devices, such as transistors 414, can be disposed over the substrate 402 on the front side 402F and configured to enable readout of the photodiodes 412. The pixel sensors 410 are disposed to receive light with a predetermined wavelength.

Accordingly, the photodiodes 412 can be operated to sense visible light of incident light in some embodiments.

A plurality of isolation structures 420 is disposed in the substrate 402 as shown in FIG. 5. In some embodiments, the isolation structure 420 includes a DTI structure, and the DTI structure can be formed by operations as mentioned above, therefore those details are omitted for brevity. In some embodiments, sidewalls and bottoms of the deep trenches are lined by a dielectric layer 422, such as a coating 422 and the deep trenches are then filled up by an insulating structure 424. The coating 422 may include a low-n material, which has a refractive index (n) less than color filter formed hereafter. In some embodiments, the insulating structure 424 filling the deep trenches can include the low-n insulating material. A planarization is then performed to remove superfluous insulating material, thus the surface of the substrate 402 on the back side 402B is exposed, and the DTI structures 420 surrounding and between the photodiodes 412 are obtained.

In some embodiments, a portion of the insulating structure 424 is then removed and thus a recess (not shown) may be formed in each DTI structure 420. Next, a conductive material is formed to fill the recess. Accordingly, a conductive structure 426 is formed over the insulating structure 424 as shown in FIG. 5. The conductive structure 426, the insulating structure 424 and the dielectric layer 422 construct a hybrid isolation 428. In other words, a hybrid isolation 428 including the dielectric layer 422, the insulating structure 424 and the conductive structure 426 is provided and disposed in the substrate 402 according to some embodiments. In some embodiments, a depth or a thickness T2 of the hybrid isolation 428 is less than the thickness T1 of the substrate 402. However, in some embodiments the depth or the thickness T2 of the hybrid isolation 428 can be substantially equal to the thickness T1 of the substrate 402. Such hybrid isolation 428 can be similar as the hybrid isolation 228 shown in FIG. 3, therefore those details are omitted in the interest of brevity. In those embodiments, the dielectric layer 422 covers at least sidewalls of the conductive structure 426. Further, the dielectric layer 422 covers sidewalls of the insulating structure 424 and a bottom surface of the insulating structure 424.

However, in some embodiments, the conductive structure 426 can be formed to fill the deep trenches directly after forming the dielectric layer 422. Consequently, a hybrid isolation 428 including the dielectric layer 422 and the conductive structure 426 can be obtained as shown in FIG. 5. In those embodiments, the dielectric layer 422 covers not only the sidewalls of the conductive structure 426 but also the bottom surface of the conductive structure 426. Such hybrid isolation 428 can be similar as hybrid isolation 328 shown in FIG. 4, therefore those details are omitted in the interest of brevity.

In some embodiments, an ARC 416 is disposed over the substrate 402 on the back side 402B, and a passivation layer 418 is disposed over the ARC 416. In some embodiments, the ARC 416 and the dielectric layer 422 include the same material and can be formed at the same time. Thus a substantially flat and even surface is obtained on the back side 402B of the substrate 402 as shown in FIG. 5.

As mentioned above, a BEOL metallization stack 430 is disposed over the front side 402F of the substrate 402. The BEOL metallization stack 430 includes a plurality of metallization layers 432 stacked in an ILD layer 434. One or more contacts of the BEOL metallization stack 430 are electrically connected to the logic device 414. In some embodiments, another substrate (not shown) can be disposed between the metallization structure 430 and external connectors such as a ball grid array (BGA) (not shown). And the BSI image sensor 400 is electrically connected to other devices or circuits through the external connectors, but the disclosure is not limited to this.

Referring to FIG. 5, in some embodiments, a plurality of color filters 450 corresponding to the pixel sensors 410 is disposed over the pixel sensors 410 on the back side 402B of the substrate 402. Further, a hybrid isolation 440 is disposed between the color filters 450 in some embodiments. In some embodiments, the hybrid isolation 440 includes a grid structure and the color filters 450 are located within the grid. Thus the hybrid isolation 440 surrounds the color filter 450, and separates the color filters 450 from each other as shown in FIG. 5. The hybrid isolation 440 can include layers with a refractive index less than the refractive index of the color filters 450. In some embodiments, the composite structure 440 can include a composite stack including at least a conductive structure 442 and an insulating structure 444 disposed over the conductive structure 442. In some embodiments, the conductive structure 442 can include W, Cu, or AlCu, and the insulating structure 444 includes a material with a refractive index less than the refractive index of the color filter 450 or a material with a refractive index less than a refractive index of Si, but the disclosure is not limited to this.

Each of the color filters 450 is disposed over each of the corresponding photodiodes 412. The color filters 450 are assigned to corresponding colors or wavelengths of lights, and configured to filter out all but the assigned colors or wavelengths of lights. Typically, the color filters 450 assignments alternate between red, green, and blue lights, such that the color filters 450 include red color filters, green color filters and blue color filters. In some embodiments, the red color filters, the green color filters and the blue color filters are arranged in a Bayer mosaic pattern, but the disclosure is not limited to this. In some embodiments, a micro-lens 460 corresponding to each pixel sensor 410 is disposed over the color filter 450. It should be easily understood that locations and areas of each micro-lens 460 correspond to those of the color filter 450 or those of the pixel sensor 410 as shown in FIG. 5.

In some embodiments, the hybrid isolation 428 including the insulating structures 424, the dielectric layers 422 and the conductive structures 426 is disposed in the substrate 402. The insulating structures 424 and/or the dielectric layers 422 of the hybrid isolation 428 provide electrical isolation between neighboring pixel sensors 410. In other words, insulating structures 424 and/or the dielectric layers 422 of the hybrid isolation 428 serve as a substrate isolation grid separating the plurality of pixel sensors 410 including the photodiodes 412 from each other, and thus reducing cross-talk. A depth T2 of the hybrid isolation 428 can be equal to or less than the thickness T1 of the substrate 402, as shown in FIG. 5. In some embodiments, the conductive structures 426 of the hybrid isolation 428 form a reflective grid. In some embodiments, a depth $D_R$ of the reflective grid 426 can be equal to or less than the depth T2 of the hybrid isolation 428. As mentioned above, the depth $D_R$ of the reflective grid 426 is related to a pitch P of the pixel sensor 410. Additionally, the dielectric layers 422 and/or the insulating structures 424 form an isolation grid 420, and the reflective grid 426 is disposed between the isolation grid 420 and the hybrid isolation 440 including the conductive structure 442 and the insulating structure 444, as shown in FIG. 5. Further, the hybrid isolation 440 overlaps the hybrid isolation 428 from a plan view.

Due to the low refractive index, the hybrid isolation 440 serves as a light guide to direct or reflect light to the color filters 450. Consequently, the hybrid isolation 440 effectively increases the amount of the light incident into the color filters 450. Further, due to the low refractive index, the hybrid isolation 440 provides optical isolation between neighboring color filters 450. The conductive structure 426 of the hybrid isolation 428 serves as a light guide or a mirror, and reflects light to the photodiode 412. Consequently, the conductive structure/reflective grid 426 effectively increases the amount of light to be absorbed by photodiode 412 and thus provides optical isolation between neighboring pixel sensors 410. On the other hands, the isolation grid 420 (including the conductive structure 424 and the dielectric layer 422 of the hybrid isolation 428) provides electrical isolation between the neighboring pixel sensors 410.

Figure 6:
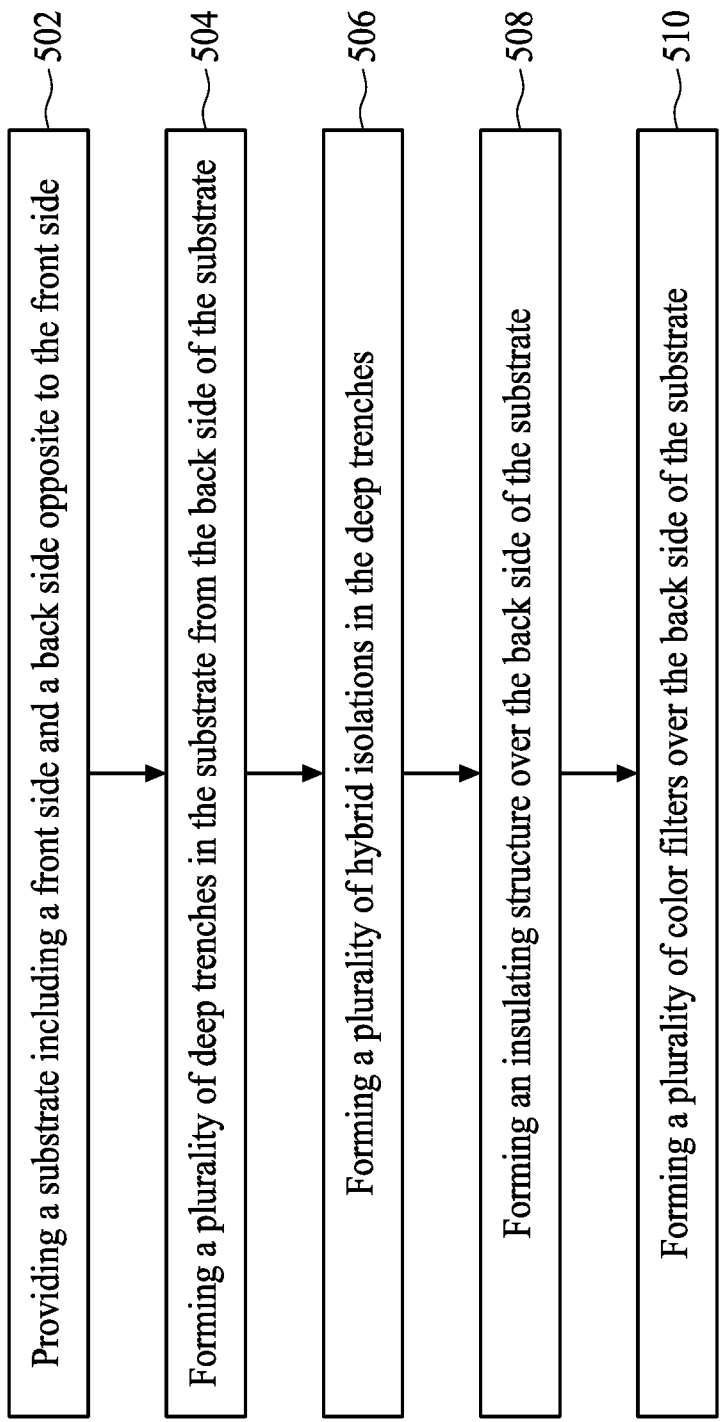
FIG. 6 is a flow chart representing a method for manufacturing a semiconductor image sensor according to aspects of the present disclosure.

Please refer to FIG. 6 and FIGS. 7A-7H. FIG. 6 shows a flow chart representing method for forming a semiconductor image sensor according to aspects of the present disclosure, and FIGS. 7A-7H are a series of cross-sectional views of a semiconductor image sensor at various fabrication stages constructed according to aspects of the present disclosure in one or more embodiments. In the present disclosure, a method of manufacturing a semiconductor image sensor 50 is also disclosed. In some embodiments, a semiconductor image sensor structure 600 can be formed by the method 50. The method 50 includes a number of operations and the description and illustration are not deemed as a limitation as the sequence of the operations. The method 50 includes a number of operations (502, 504, 506, 508, and 510). Additionally, it should be noted that elements the same in FIGS. 2 and 7A-7H are designated by the same numerals, and can include the same materials, thus those details are omitted in the interest of brevity.

In operation 502, a substrate 602 is provided or received. As mentioned above, the substrate 602 has a front side 602F and a back side 602B opposite to the front side 102F. The semiconductor image sensor 600 includes a plurality of pixel sensors 610 typically arranged within an array, and each of the pixel sensors 610 includes a light-sensing device such as a photodiode 612 disposed in the substrate 602. Further, logic devices, such as a transistor 614, can be disposed over the substrate 602 on the front side 602F and configured to enable readout of the photodiodes 612. The pixel sensors 610 are disposed to receive light with a predetermined wavelength. As mentioned above, the photodiodes 612 can be operated to sense visible light of incident light in some embodiments.

In some embodiments, a BEOL metallization stack 630 is disposed over the front side 602F of the substrate 602. The BEOL metallization stack 630 includes a plurality of metallization layers 632 stacked in an ILD layer 634. One or more contacts of the BEOL metallization stack 630 is electrically connected to the logic device 614. In some embodiments, another substrate (not shown) can be disposed between the metallization structure 630 and external connectors such as a ball grid array (BGA) (not shown). And the BSI image sensor 600 is electrically connected to other devices or circuits through the external connectors, but the disclosure is not limited to this.

Figure 7B:
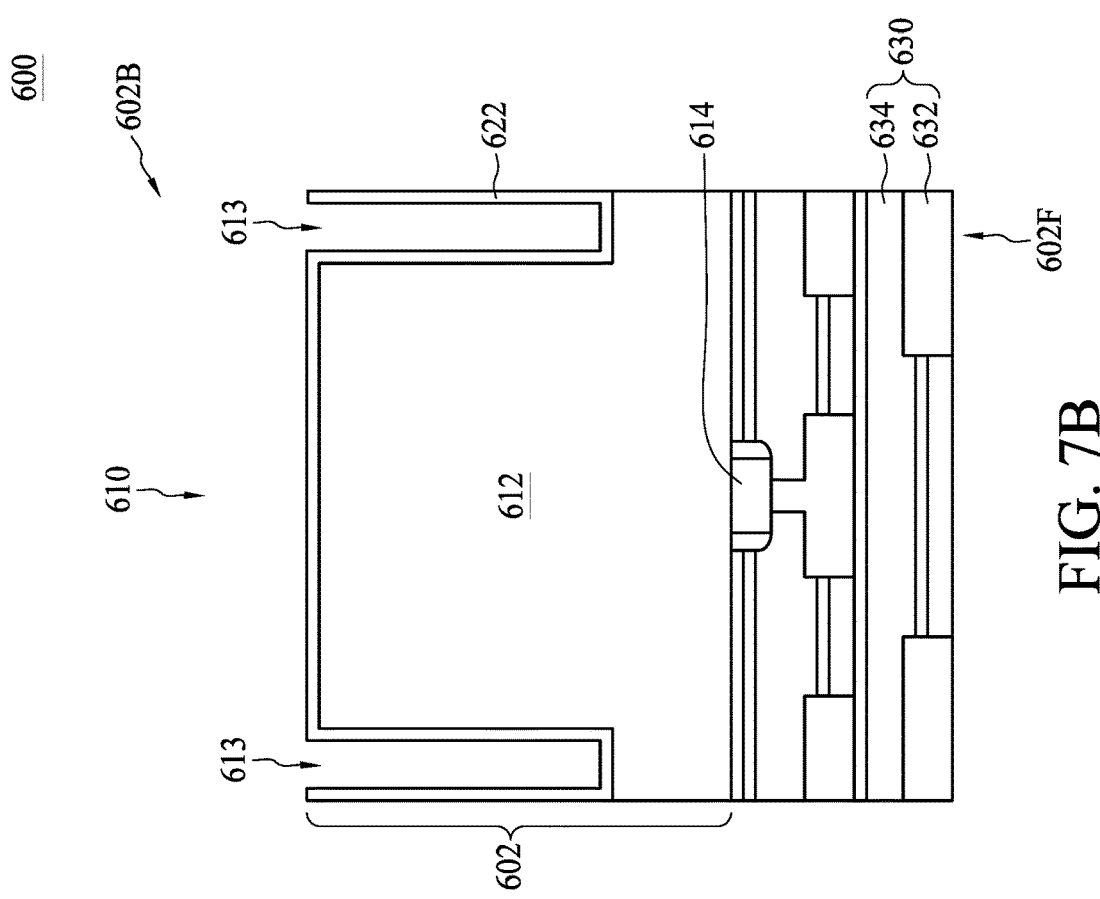
FIG. 7A through 7H illustrate a series of cross-sectional views of a portion of a semiconductor image sensor at various fabrication stages constructed according to aspects of the present disclosure in one or more embodiments.
Figure 7A:
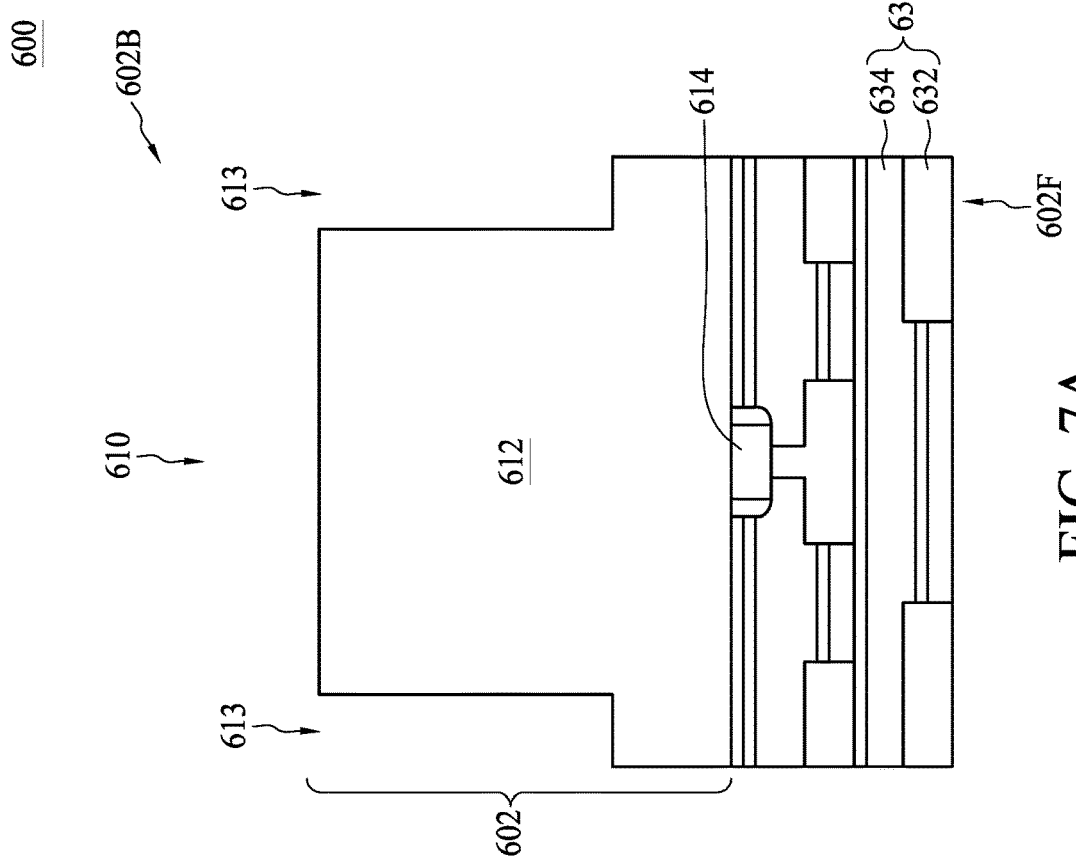

In operation 504, a first etch is performed from the back side 602B of the substrate 602. The first etch results in a plurality of deep trenches 613 surrounding and between the photodiodes 612 of the pixel sensors 610, as shown in FIG. 7A.

In operation 506, a plurality of hybrid isolation structures 620 is formed in the deep trenches 613. In some embodiment, the forming of the hybrid isolation structures 620 further includes following operations. Referring to FIG. 7B, sidewalls and bottoms of the deep trenches 613 are lined by a dielectric layer 622, such as a coating 622. In some embodiments, the coating 622 may include a low-n material, which has a refractive index (n) less than color filter formed hereafter. The low-n material can include SiO or HfO, but the disclosure is not limited to this.

Figure 7D:
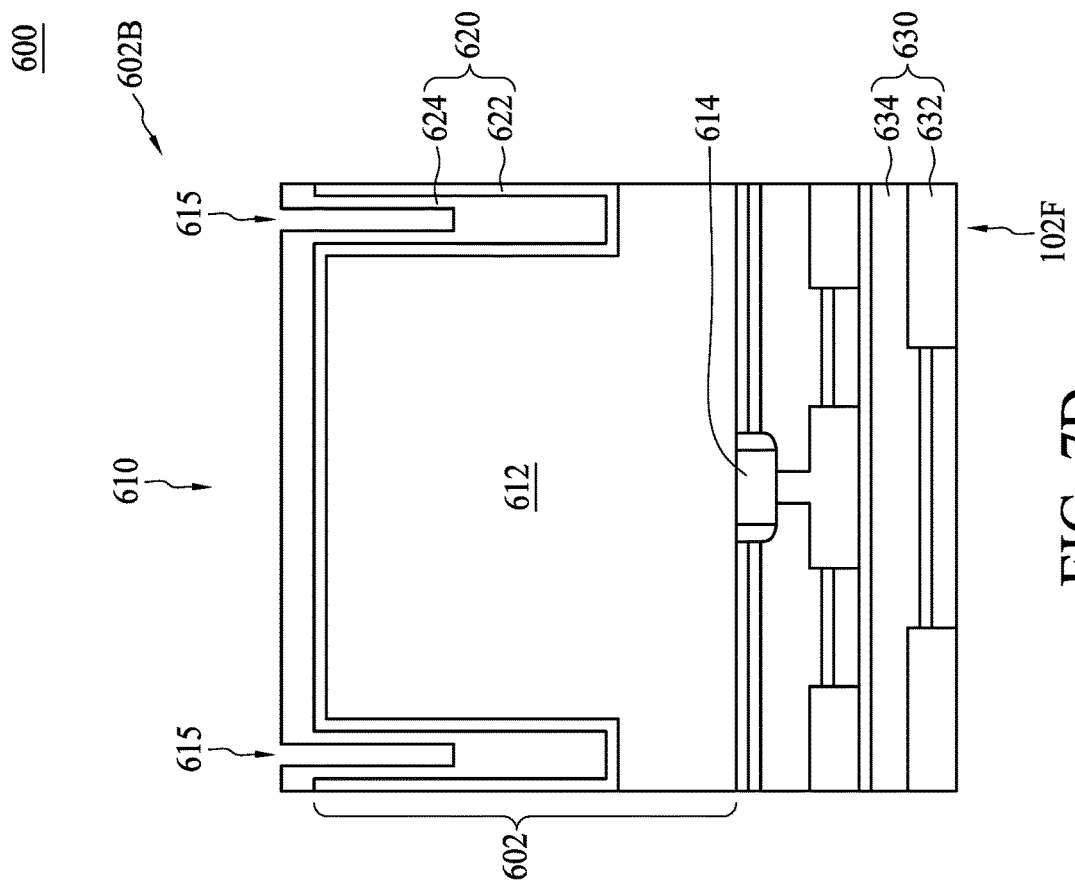
Figure 7C:
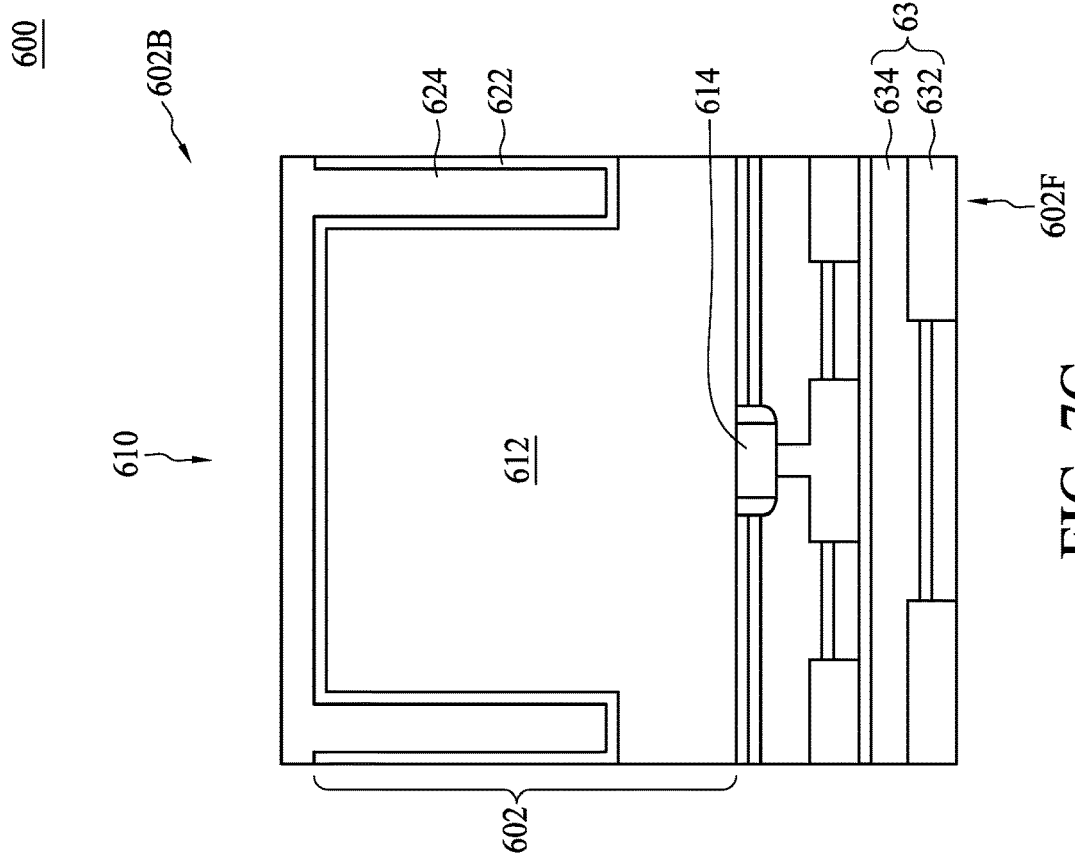

Referring to FIG. 7C, an insulating material 624 such as SiO is then formed to fill the deep trenches 613 using any suitable deposition technique, such as CVD. In some embodiments, the insulating structure 624 filling the deep trenches can include the low-n insulating material.

Referring to FIG. 7D, in some embodiments, the insulating material 624 is then recessed from the back side 602B of the substrate 602. Consequently, a plurality of DTI structures 620 surrounding and between the photodiodes 612 of the pixel sensors 610 are obtained as shown in FIG. 7D. Further, a plurality of recesses 615 is formed in each DTI structure 620.

Figure 7E:
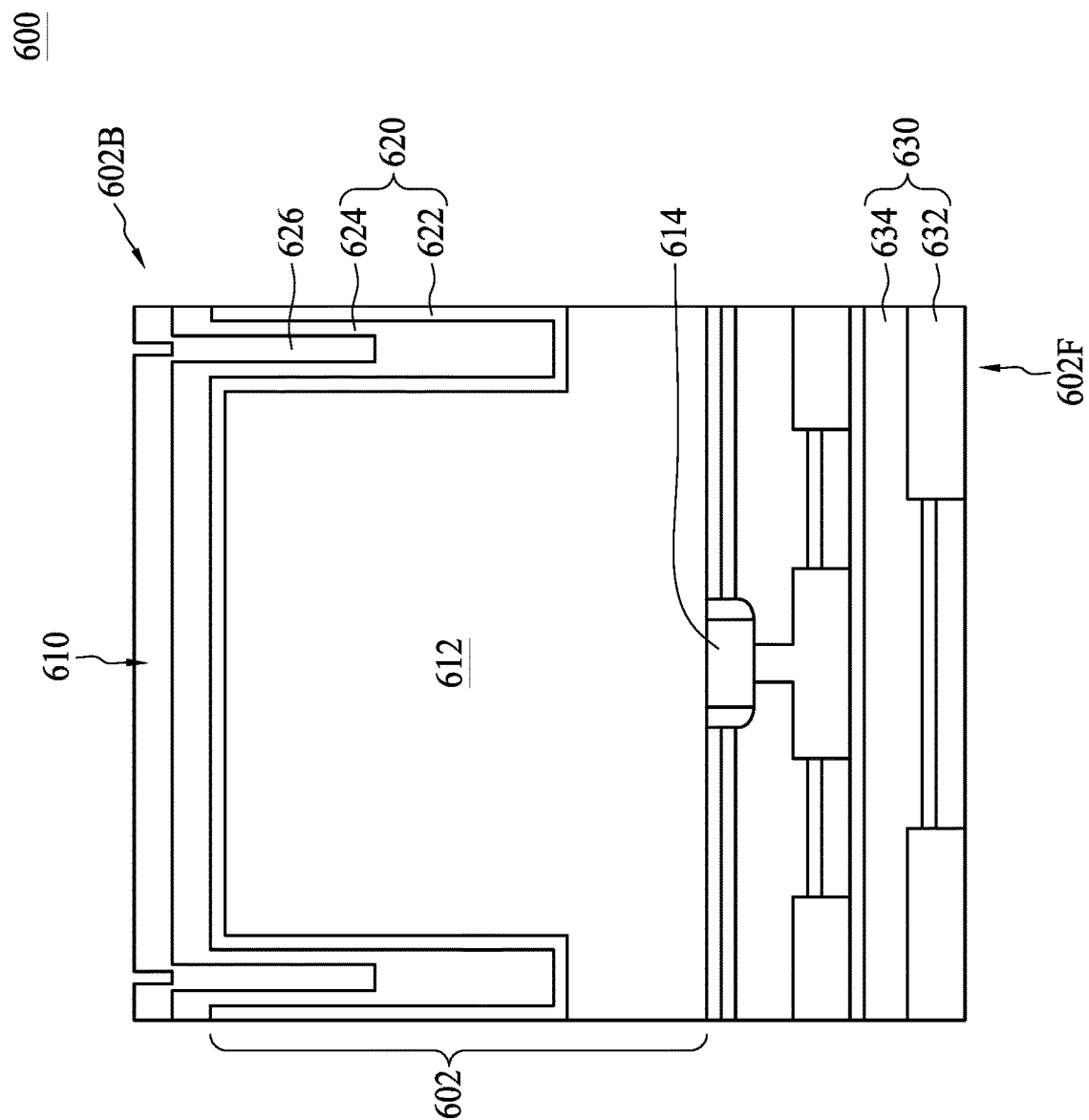
Figure 7F:
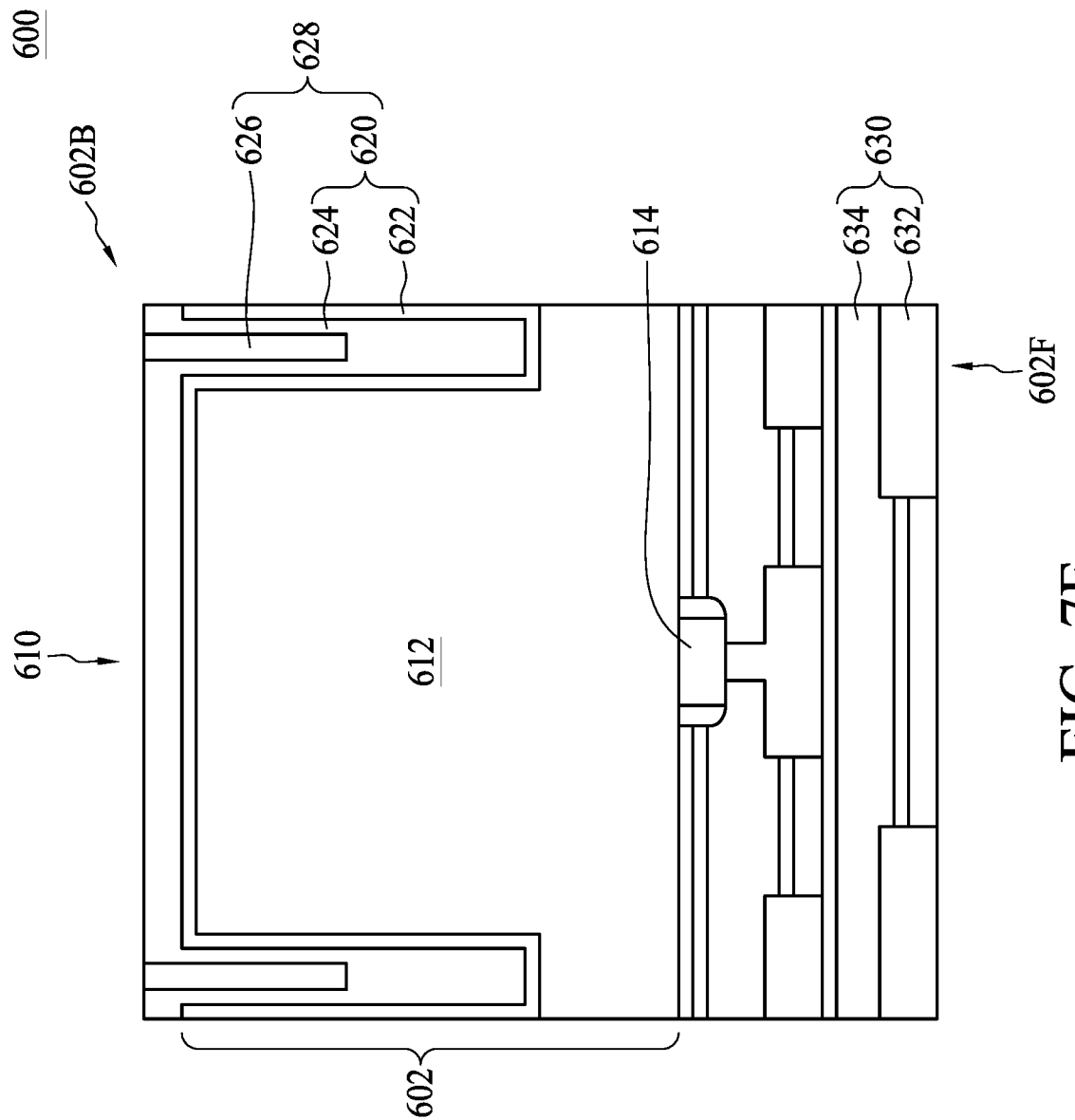

Referring to FIG. 7E, Next, a conductive material 626 such as W, Cu, or AlCu, or other suitable material is formed to fill the recesses 613. Accordingly, a conductive structure 626 is formed over the insulating structure 624 as shown in FIG. 7E. Referring to FIG. 7F, a planarization then can be performed to remove the superfluous conductive material 626, such that top surfaces of the insulating materials 624 are exposed from the back side 602B of the substrate 602. Accordingly, the conductive structure 626, the insulating structure 624 and the dielectric layer 622 construct the hybrid isolations 628 surrounding each photodiode 612 of the pixel sensor 610. In some embodiments, an ARC and a passivation layer (not shown) can be disposed over the insulating material 624. Thus a substantially flat and even surface is obtained on the back side 602B of the substrate 602.

Figure 7G:
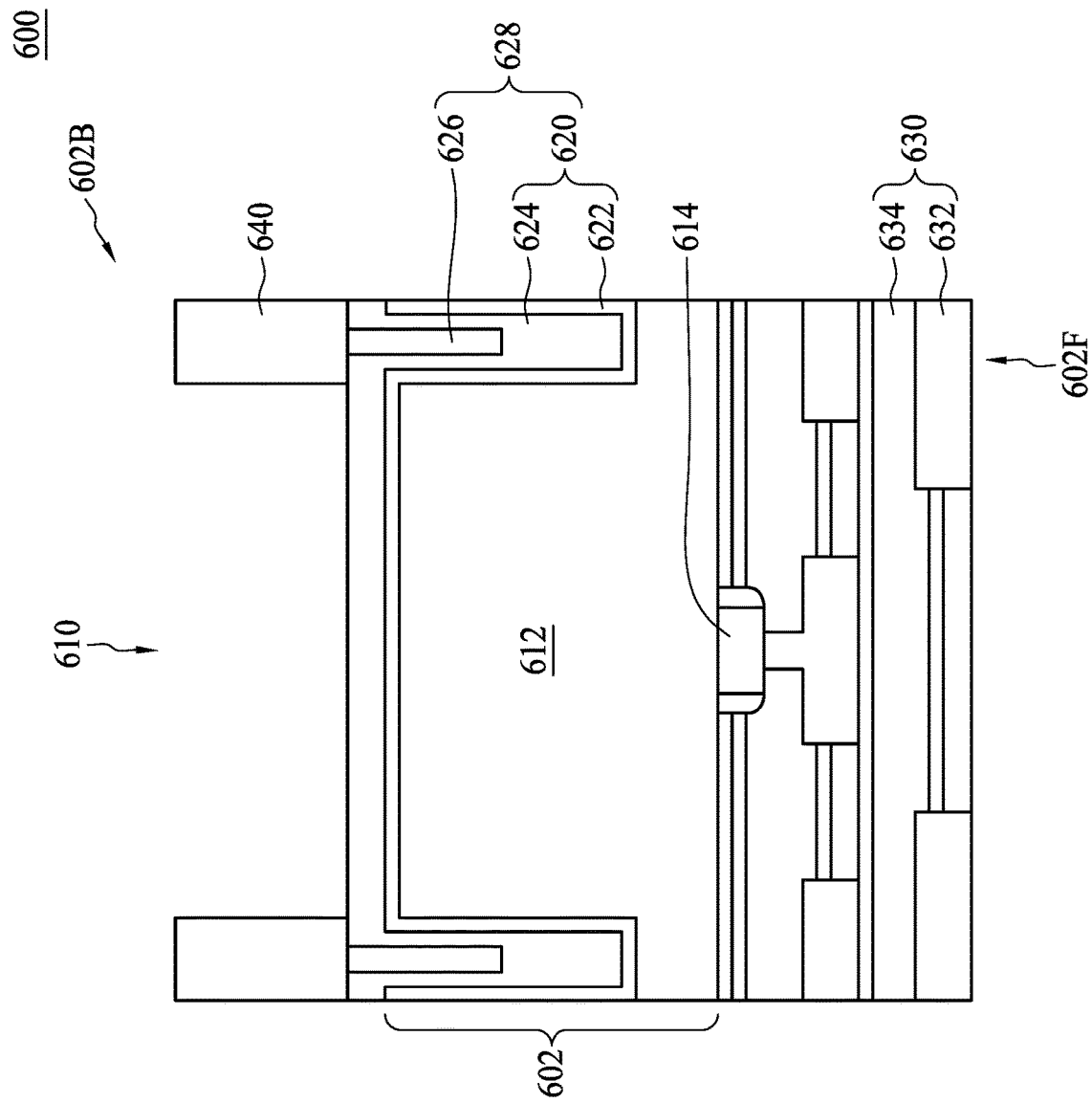

In operation 508, an insulating structure 640 including a grid structure is formed over the back side 602B of the substrate 602, as shown in FIG. 7G. In some embodiments, the insulating structure 640 can include materials with a refractive index less than the refractive index of the color filters to be formed or less than a refractive index of Si, but the disclosure is not limited to this.

Figure 7H:
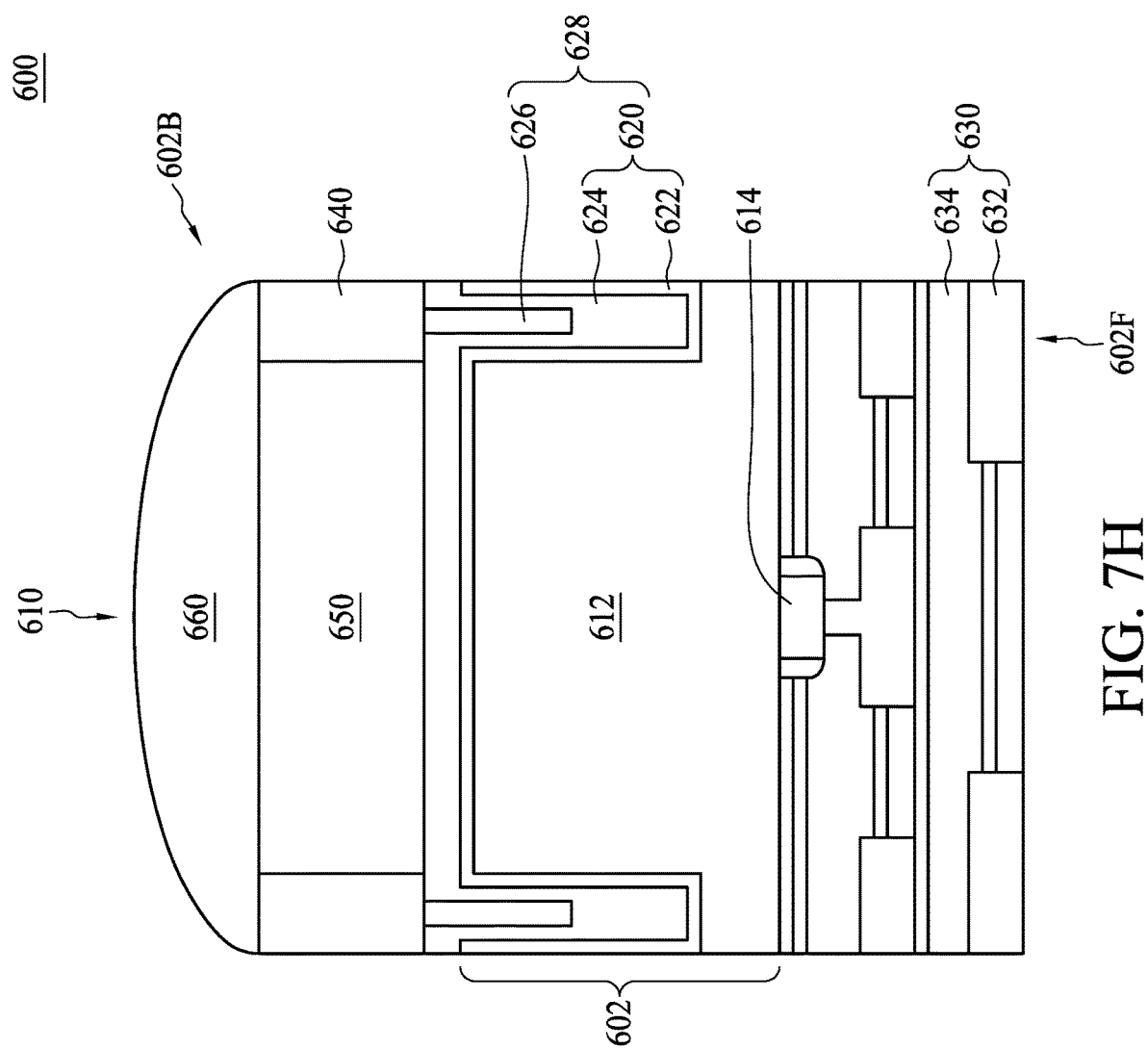

In operation 510, a plurality of color filters 650 are disposed within the grid of the insulating structure 640. Thus the insulating structure 640 surrounds each color filter 650, and separates the color filters 650 from each other as shown in FIG. 7H. Further, the conductive structures 626 are disposed between the insulating structures 624 and the insulating structure 640, as shown in FIG. 7H. In some embodiments, a plurality of micro-lenses 660 corresponding to each pixel sensor 610 is disposed over the color filters 650. It should be easily understood that locations and areas of each micro-lens 660 correspond to those of the color filter 650 or those of the pixel sensor 610 as shown in FIG. 7H.

Accordingly, the present disclosure therefore provides a BSI image sensor including at least a hybrid isolation disposed in the substrate. The hybrid isolation includes at least a conductive structure and a dielectric layer. In some embodiments, the hybrid isolation includes an insulating structure under the conductive structure. Further, the insulating structures and/or the dielectric layers form an isolation grid providing electrical isolation between neighboring pixel sensors, while the conductive structures form a reflective grid providing optical isolation between neighboring photodiodes. And a low-n structure or another hybrid isolation providing optical isolation between neighboring color filters can be formed over the substrate on the back side. Accordingly, cross-talk between neighboring pixel sensors and signal-to-noise ratio (SNR) are reduced. Further, quantum efficiency and angular response are improved. Consequently, the sensitivity of the BSI image sensor is improved.

In some embodiments, a BSI image sensor is provided. The BSI image sensor includes a substrate including a front side and a back side opposite to the front side, a plurality of pixel sensors arranged in an array, an isolation grid disposed in the substrate and separating the plurality of pixel sensors from each other, a reflective grid disposed over the isolation grid on the back side of the substrate, an a low-n grid disposed over the back side of the substrate and overlapping the reflective grid from a top view. In some embodiments, depth of the reflective grid is less than a depth of the isolation grid. In some embodiments, a width of the low-n grid is greater than a width of the reflective grid.

In some embodiments, a BSI image sensor is provided. The BSI image sensor includes a substrate, a pixel sensor, and a hybrid isolation surrounding the pixel sensor in the substrate. The hybrid isolation includes a conductive structure, a dielectric layer covering at least sidewalls of the conductive structure, and a first insulating structure disposed in the substrate. In some embodiments, a thickness of the conductive structure is greater than a thickness of the first insulating layer.

In some embodiments, a BSI image sensor is provided. The BSI image sensor includes a substrate including a front side and a back side opposite to the front side, a pixel sensor, a color filter corresponding to the pixel sensor and disposed over the substrate on the back side, a first insulating structure disposed in the substrate and surrounding the pixel sensor, a first conductive structure disposed in the substrate and over the first insulating structure on the back side of the substrate and surrounding the pixel sensor, a second insulating structure surrounding the color filter on the back side of the substrate, and a second conductive structure surrounding the color filter on the back side of the substrate. In some embodiments, the second insulating structure and the second conductive structure overlap the first insulating structure and the first conductive structure from a plan view. In some embodiments, the first conductive structure is aligned with the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A back side illumination (BSI) image sensor comprising:
   a substrate comprising a front side and a back side opposite to the front side;
   a plurality of pixel sensors arranged in an array,
   an isolation grid disposed in the substrate and separating the plurality of pixel sensors from each other;
   a reflective grid disposed over the isolation grid on the back side of the substrate, and a depth of the reflective grid being less than a depth of the isolation grid; and
   a low-n grid disposed over the back side of the substrate and overlapping the reflective grid from a plan view,
   wherein a width of the low-n grid is greater than a width of the reflective grid.

2. The BSI image sensor of claim 1, further comprising a plurality of color filters disposed over the substrate on the back side.

3. The BSI image sensor of claim 2, wherein the low-n grid is disposed between and separating the color filters from each other.

4. The BSI image sensor of claim 1, wherein the reflective grid is disposed between the low-n grid and the isolation grid.

5. The BSI image sensor of claim 1, wherein the low-n grid comprises an insulating material.

6. The BSI image sensor of claim 1, wherein the isolation grid comprises at least an insulating material.

7. The BSI image sensor of claim 1, wherein the reflective grid comprises a conductive material.

8. The BSI image sensor of claim 1, wherein the depth of the isolation grid is substantially equal to or less than a thickness of the substrate.

9. The BSI image sensor of claim 1, wherein the low-n grid is separated from the reflective grid.

10. The BSI image sensor of claim 1, wherein the low-n grid is in contact with the reflective grid.

11. A back side illumination (BSI) image sensor comprising:
    a substrate;
    a pixel sensor; and
    a hybrid isolation surrounding the pixel sensor in the substrate, and the hybrid isolation comprising:
       a conductive structure;
       a dielectric layer covering at least sidewalls of the conductive structure; and
       a first insulating structure disposed in the substrate,
    wherein a thickness of the conductive structure is greater than a thickness of the first insulating layer.

12. The BSI image sensor of claim 11, wherein a thickness of the hybrid isolation is substantially equal to a thickness of the substrate.

13. The BSI image sensor of claim 11, wherein the dielectric layer covers sidewalls and a bottom surface of the first insulating structure.

14. The BSI image sensor of claim 11, further comprising a second insulating structure disposed over the substrate on the back side.

15. The BSI image sensor of claim 14, wherein the conductive structure is disposed between the first insulating structure and the second insulating structure.

16. A back side illumination (BSI) image sensor comprising:
    a substrate comprising a front side and a back side opposite to the front side;
    a pixel sensor;
    a color filter corresponding to the pixel sensor and disposed over the substrate on the back side;
    a first insulating structure disposed in the substrate and surrounding the pixel sensor;
    a first conductive structure disposed in the substrate and over the first insulating structure on the back side of the substrate and surrounding the pixel sensor;
    a second insulating structure surrounding the color filter on the back side of the substrate; and
    a second conductive structure surrounding the color filter on the back side of the substrate,
    wherein the second insulating structure and the second conductive structure overlap the first insulating structure and the first conductive structure from a plan view, the first conductive structure is aligned with the second conductive structure.

17. The BSI image sensor of claim 16, further comprising a dielectric layer covering at least sidewall and a bottom surface of the first insulating structure.

18. The BSI image sensor of claim 16, wherein the second insulating structure cover sidewalls and a top surface of the second conductive structure.

19. The BSI image sensor of claim 16, wherein the first conductive structure is separated from the second conductive structure.

20. The BSI image sensor of claim 19, wherein the first insulating structure is aligned with the second insulating structure and separated from the second insulating structure.

* * * * *